US012765076B2

(12) United States Patent
Habans et al.

(10) Patent No.: US 12,765,076 B2
(45) Date of Patent: Oct. 13, 2026

(54) PHOTOVOLTAIC MODULE COMPRISING AN ENCAPSULATION STRUCTURE BASED ON AT LEAST ONE POLYMER MATERIAL AND LOCALLY SOFTENED

(71) Applicant: COMMISSARIAT A L'ENERGIE ATOMIQUE ET AUX ENERGIES ALTERNATIVES, Paris (FR)

(72) Inventors: Dylan Habans, Grenoble (FR); Jean-Baptiste Charpentier, Grenoble (FR); Aude Derrier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/990,768

(22) Filed: Dec. 20, 2024

(65) Prior Publication Data

US 2025/0212530 A1 Jun. 26, 2025

(51) Int. Cl.
*H10F 19/80* (2025.01)
*H10F 19/90* (2025.01)

(52) U.S. Cl.
CPC ......... *H10F 19/804* (2025.01); *H10F 19/906* (2025.01)

(58) Field of Classification Search
None
See application file for complete search history.

(56) References Cited

U.S. PATENT DOCUMENTS

2012/0301696 A1* 11/2012 Watanabe ............... D01F 1/106 428/220
2017/0012576 A1* 1/2017 Inaba ...................... H02S 40/34
2017/0092795 A1* 3/2017 Inaba ...................... H10F 19/85
2019/0334046 A1 10/2019 Ikoma et al.
2020/0274012 A1* 8/2020 Cassagne ................ H02S 40/10

* cited by examiner

*Primary Examiner* — Dustin Q Dam
(74) *Attorney, Agent, or Firm* — Jason A. Smith; Shumaker, Loop & Kendrick, LLP

(57) ABSTRACT

The invention relates to a photovoltaic module including a photovoltaic unit having a plurality of photovoltaic cells electrically connected in series and spaced apart from one another, the adjacent photovoltaic cells being electrically connected pairwise by a metal interconnector which extends at least in part into an interconnection space separating said adjacent photovoltaic cells, an encapsulation structure made of a polymer-based encapsulation material, which sandwiches the opposite sides of the photovoltaic cells, defining a region of cell coverage, and the interconnector in the interconnection space, defining a region of interconnector coverage, and a spacer incorporated into the encapsulation structure and partially superposed on the interconnector in the region of interconnector coverage, the spacer being made of a material having, at least at a temperature of −40° C., a modulus of elasticity lower than the modulus of elasticity of the encapsulation material.

16 Claims, 7 Drawing Sheets

[Fig 1]
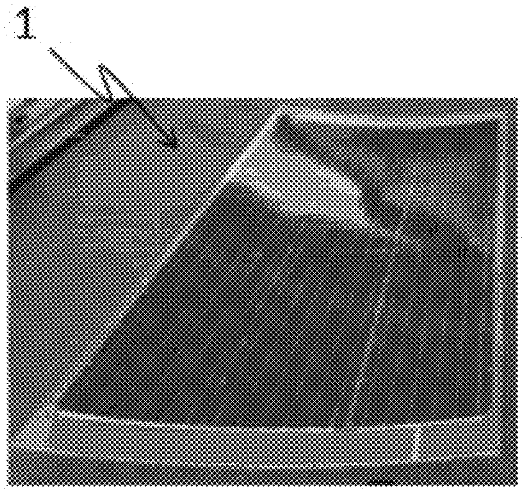
[Fig 2]
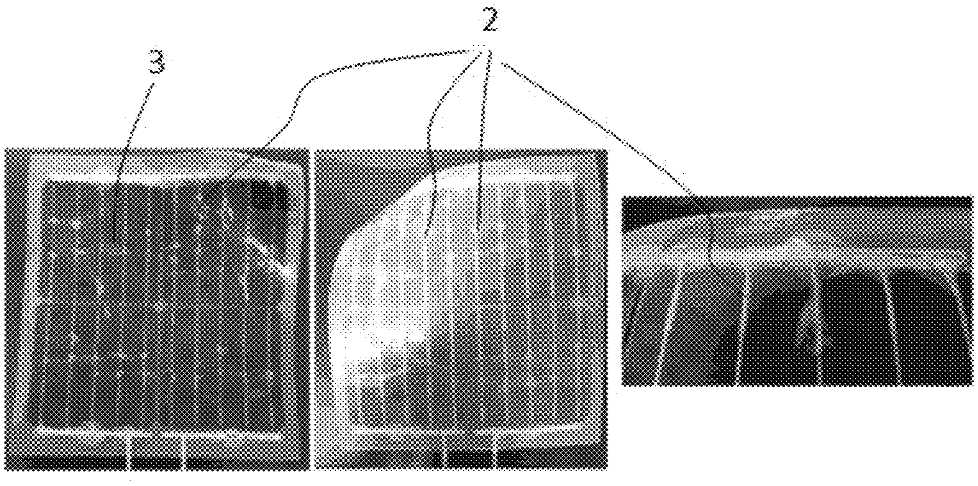

[Fig 3]
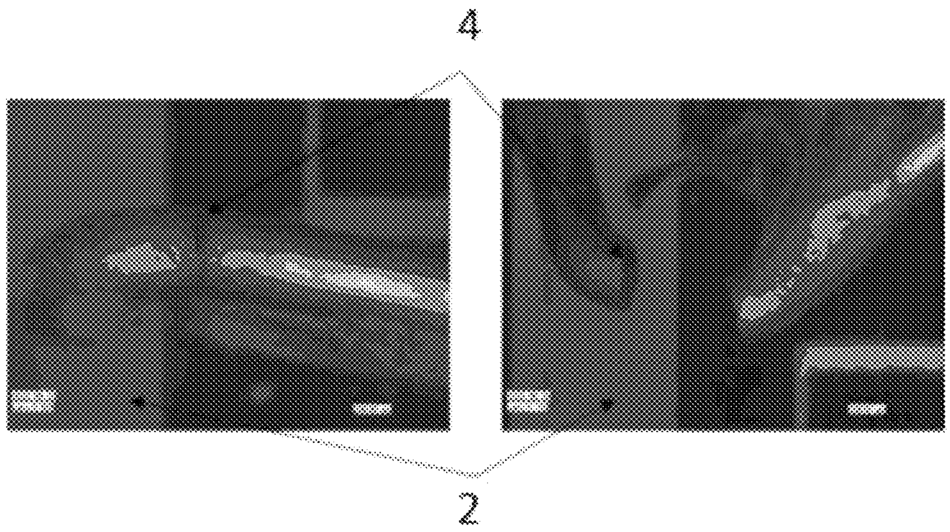
[Fig 4]
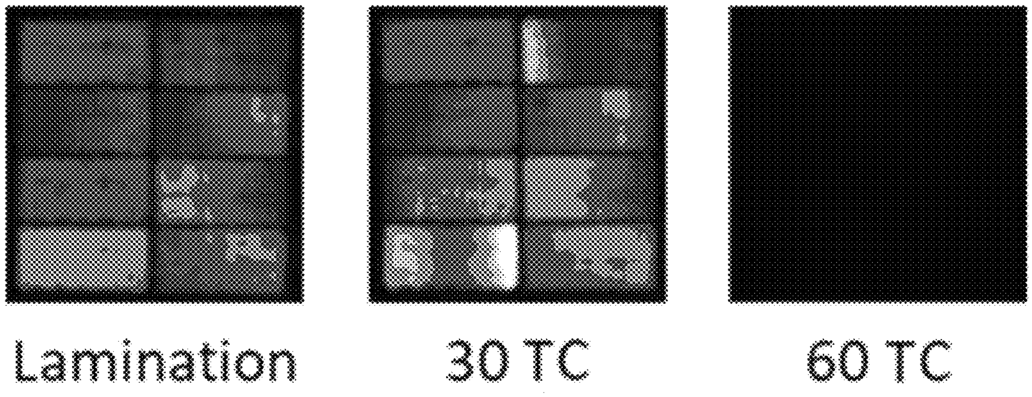

[Fig 5]
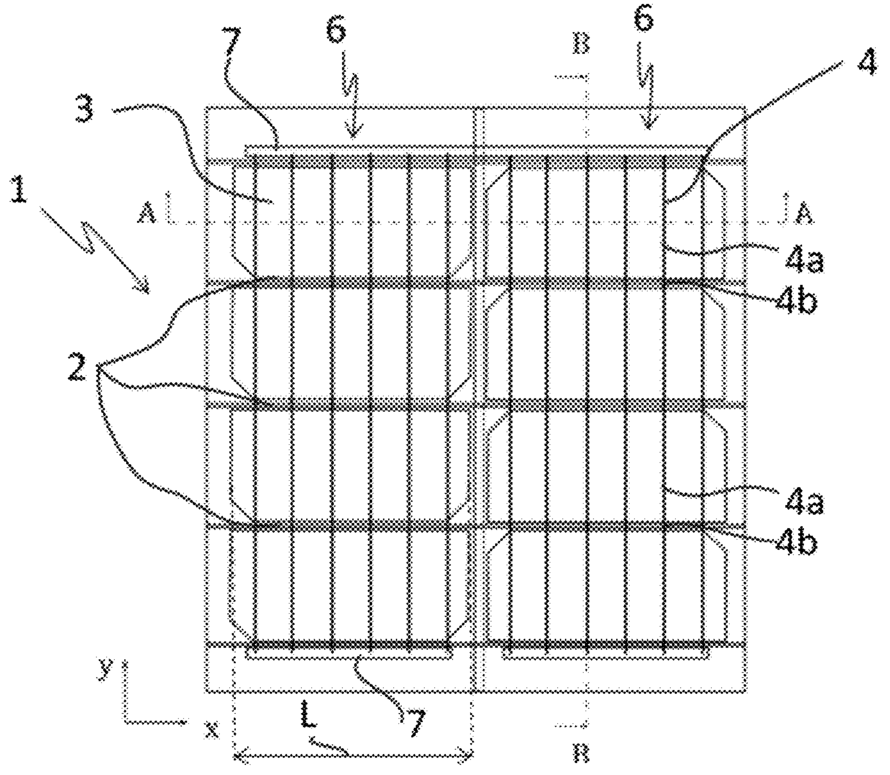
[Fig 6]
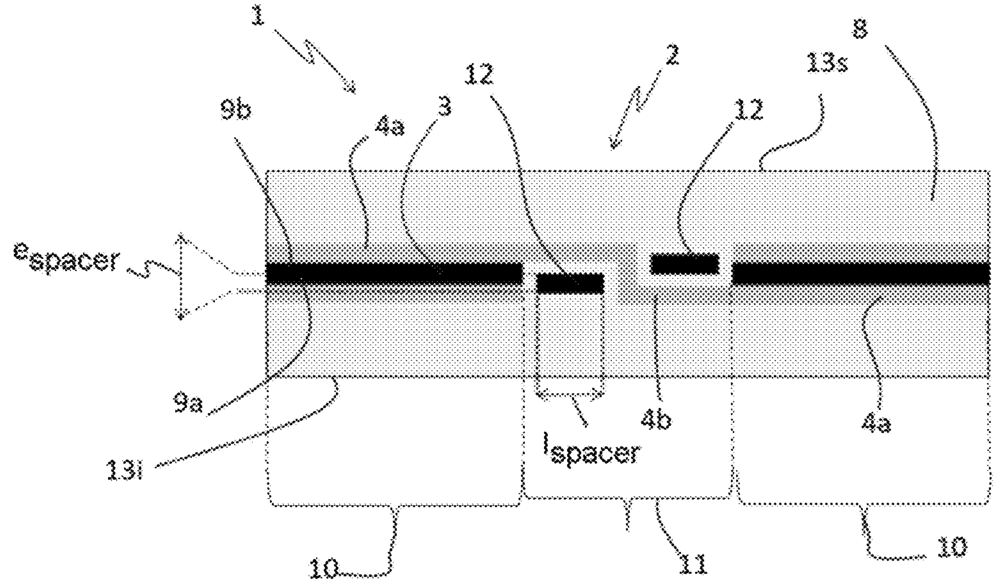

[Fig. 7]
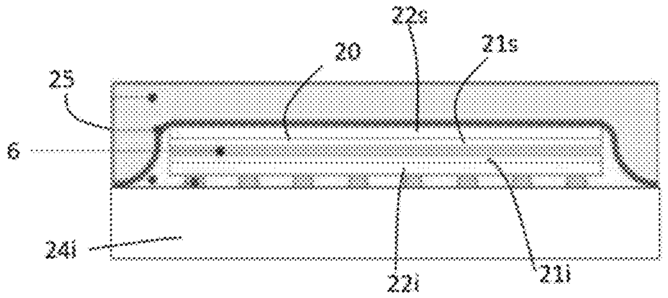
[Fig. 8]
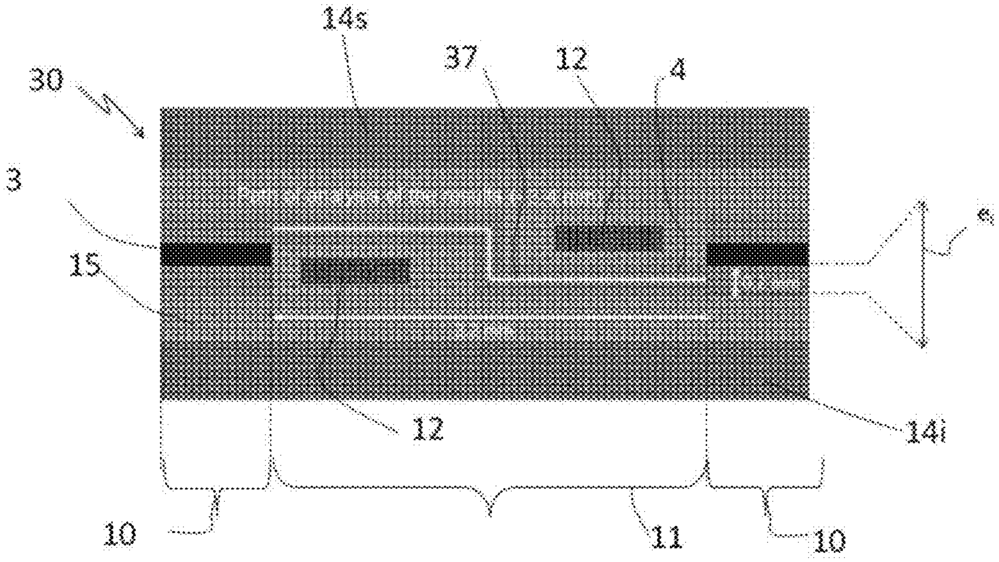

[Fig. 9]
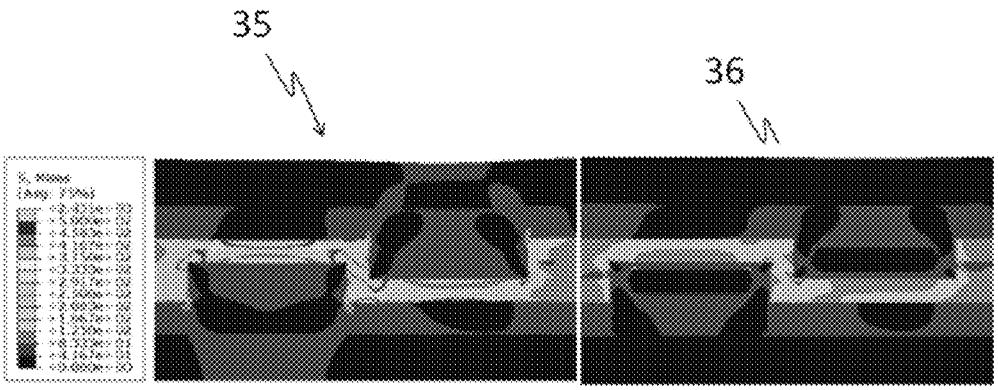
[Fig. 10]
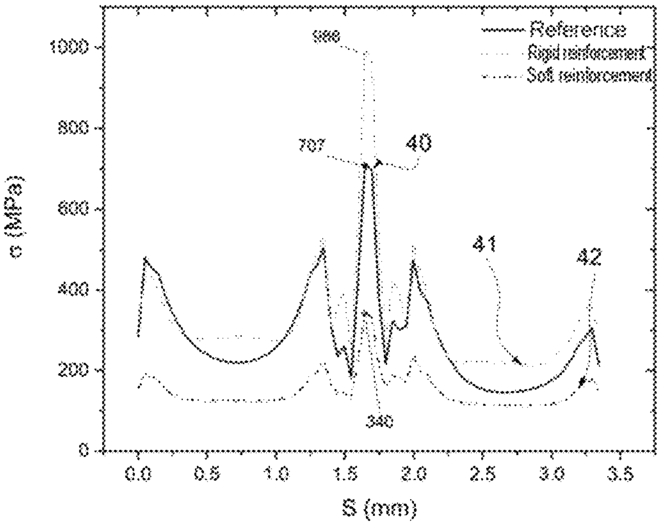

[Fig. 11]
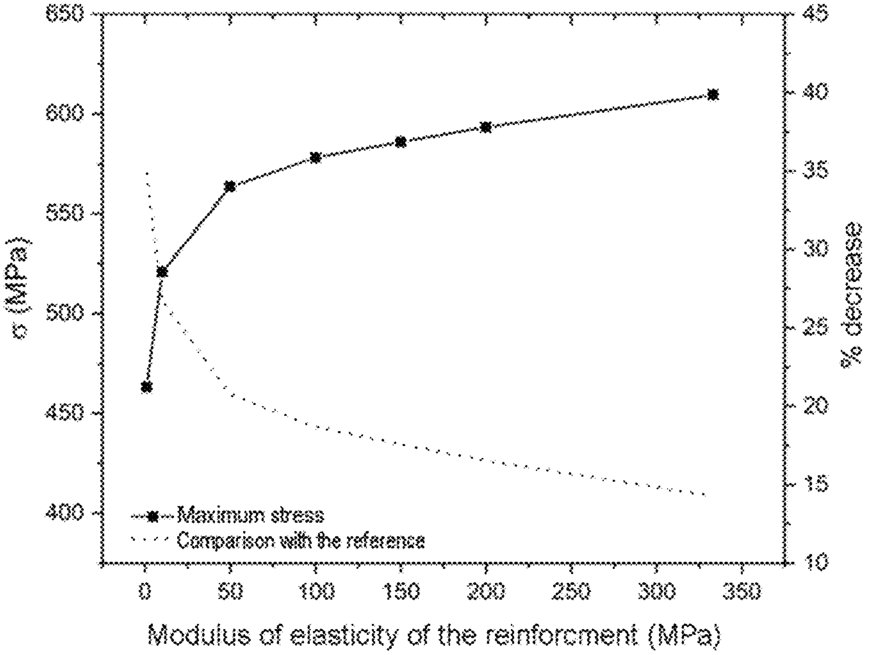
[Fig. 12]
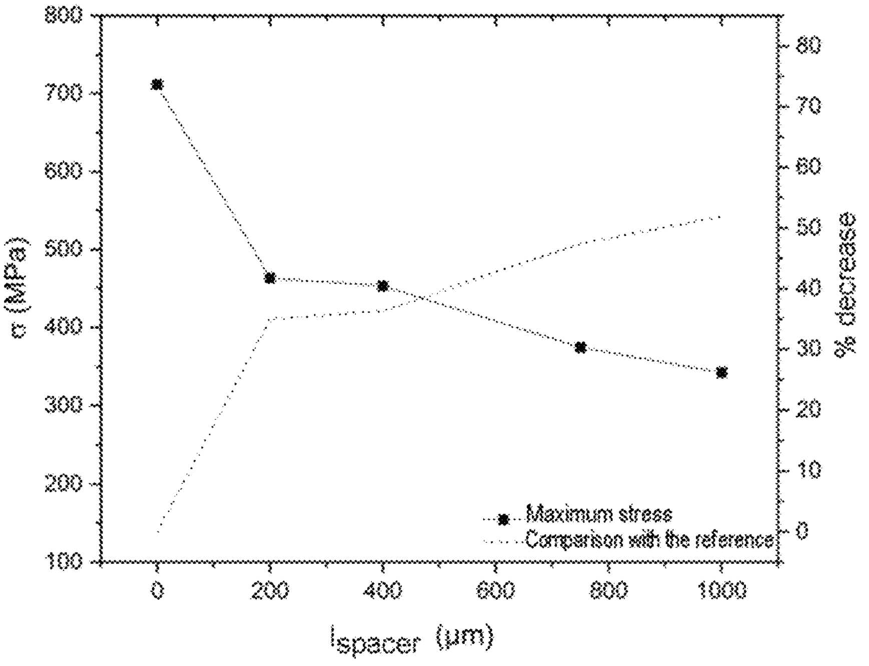

[Fig. 13]
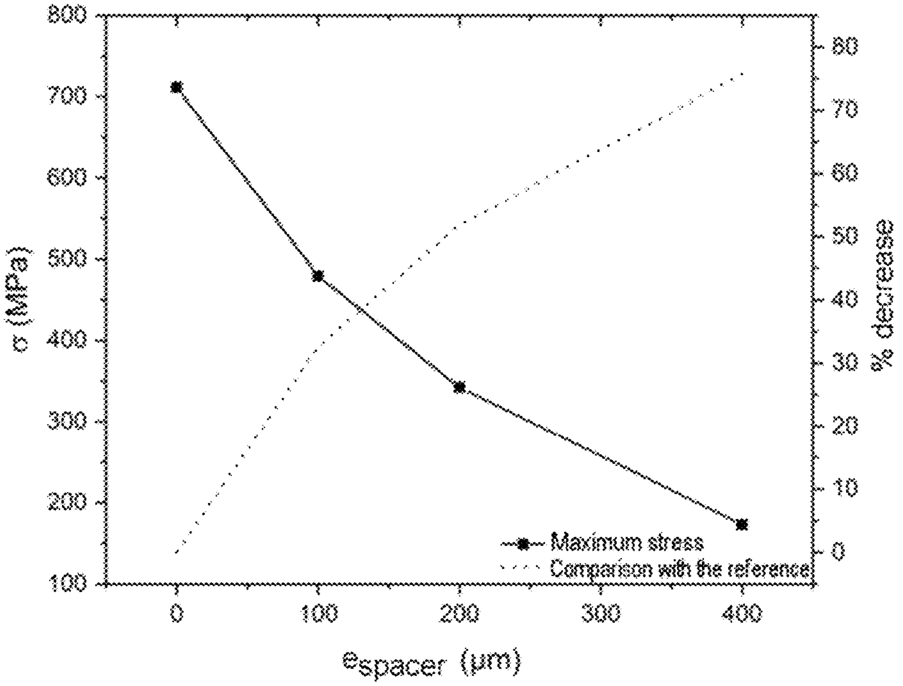

PHOTOVOLTAIC MODULE COMPRISING AN ENCAPSULATION STRUCTURE BASED ON AT LEAST ONE POLYMER MATERIAL AND LOCALLY SOFTENED

TECHNICAL FIELD

The present invention relates to the resistance to thermal cycling of photovoltaic modules comprising photovoltaic cells integrated into an encapsulation structure based on at least one polymer material.

PRIOR ART

The integration of photovoltaic modules into buildings, infrastructure or vehicles is a straightforward way of increasing the area of collection of solar radiation for mass power generation.

However, this integration approach requires the shape and aesthetics of the photovoltaic modules to be altered, and their weight to be reduced, while guaranteeing a regulatory-compliant level of performance and durability, and while remaining in keeping with progress toward lowering environmental footprint, with a view to achieving the objective of net-zero carbon by 2035.

Thermoplastic polymer materials are low cost, and have good mechanical properties, a low density and a good recyclability, making them good candidates for the manufacture of lightweight photovoltaic modules. They may thus be used to cover photovoltaic cells and hold them together in a rigid structure.

However, these materials are polymers. As such, they have a high tendency to deform under the effect of temperature, characterized by a high coefficient of thermal expansion (CTE). Each polymer has its own CTE which depends on its composition and on its production process. In particular, the CTE of many polymers is about ten times greater than the CTE of many metals and up to one hundred times greater than the CTE of silicon.

FIG. 1 illustrates a first example of degradation of such a type of photovoltaic module 1, called bowing, after manufacture by lamination. Bowing is a flatness defect of the photovoltaic module that develops during cooling of the photovoltaic module following lamination thereof. It is generally caused by a difference in coefficient of thermal expansion between the front side and the back side of the photovoltaic module.

FIG. 2 illustrates a number of examples of degradation undergone by such photovoltaic modules after thermal cycling, here observed in regions 2 where electrical interconnectors cover the photovoltaic cells 3. Under the effect of high thermal stresses, delamination occurs between the photovoltaic cells and/or the interconnectors and the polymer encapsulant. The polymer materials are also torn, indicative of the high stress level reached in these regions.

The difference between, on the one hand, the CTE of the silicon from which the photovoltaic cells 4 are made, or the CTE of the metals such as copper used to form the interconnectors that electrically connect the photovoltaic cells of the module, and, on the other hand, the CTE of the one or more polymers of the photovoltaic module, may lead to extreme localisation of thermal stresses in the metal parts of the modules. This leads to degradation that greatly affects the performance of the modules.

A recurrent problem observed during thermal cycling is rupture of the interconnectors 4 connecting the photovoltaic cells, leading to a de facto inoperability of the photovoltaic module, i.e. an inability to generate electricity. FIG. 3 shows photographs acquired by optical microscopy illustrating ruptures of interconnectors 2. One example of inoperability after 60 cycles of thermal deformation of a photovoltaic module comprising 8 units of photovoltaic cells has been shown in FIG. 4, the inoperability being due to interconnector rupture as illustrated in FIG. 3.

It has already been tested whether reducing the thickness of the polymer encapsulation structure allows the occurrence of such degradation to be avoided, but doing so may result in the photovoltaic module being unable to pass regulatory certification tests, in particular impact and bending-strength tests. Reinforcing the polymer encapsulation structure with fibres or fabrics in order to make the module stiffer and more resistant to thermal cycling has also been envisaged. However, this would imply substantial modification of the processes employed, complicating and slowing down industrial development of these composite modules. Furthermore, the presence of fibres modifies the optical properties and degrades the energy efficiency of the photovoltaic module.

There is therefore a need to improve the resistance to thermal cycling of photovoltaic modules comprising a polymer-based encapsulation structure.

SUMMARY OF THE INVENTION

The invention provides a photovoltaic module comprising:

- a photovoltaic unit comprising a plurality of photovoltaic cells electrically connected in series and spaced apart from one another, adjacent photovoltaic cells being electrically connected pairwise by a metal interconnector which extends at least in part into an interconnection space separating said adjacent photovoltaic cells,
- an encapsulation structure based on at least one polymer encapsulation material, which sandwiches the opposite sides of the photovoltaic cells, defining a cell coverage area, and the interconnector in the interconnection space, defining an interconnector coverage area, and
- a spacer incorporated into the encapsulation structure and partially superposed on the interconnector in the interconnector coverage area, the spacer being made of a material having, at least at a temperature of −40° C., a modulus of elasticity lower than the modulus of elasticity of the encapsulation material.

During a temperature variation representative of a thermal cycle to which the PV module may be subjected in use, for example as defined in the standard IEC61215, the spacer deforms more easily than the interconnector in order to accommodate deformations of thermal origin of the encapsulation structure. This thus makes it possible to limit concentration of stresses in the interconnector, and reduces the risk of rupture and inoperability of the PV module.

Preferably, the material of the spacer has a modulus of elasticity more than 2 times, preferably more than 5 times, or even more than 10 times lower than the modulus of elasticity of the encapsulation material at a temperature of −40° C.

Preferably, the material of the spacer has a modulus of elasticity lower than the modulus of elasticity of the encapsulation material at a temperature of 20° C., and preferably at any temperature between −40° C. and 20° C.

The modulus of elasticity is measured according to the standard NF EN ISO 527-1.

The material of the spacer may have a modulus of elasticity, measured at −40° C., lower than 1 GPa. Preferably, the material of the spacer has a modulus of elasticity, measured at −40° C., between 0.1 MPa and 300 MPa, and preferably between 1 MPa and 10 MPa.

Preferably, the material of the spacer has a coefficient of thermal expansion measured at −40° C. of between $10^{-7}$ $K^{-1}$ and $10^{-4}$ $K^{-1}$.

Preferably, the ratio between the CTE of the material of the spacer and the CTE of the encapsulation material is between 0.1 and 1, the CTE being measured at −40° C.

The coefficient of thermal expansion is measured according to international standard ISO 11359-2.

The material of the spacer may be a composite or polymer material.

Preferably, the material of the spacer is an elastomer, in particular chosen from silicone elastomers, rubbers, fluoroelastomers, thermoplastic elastomers and blends thereof. For example, the material of the spacer is a translucent alkoxy-based silicone.

Preferably, the spacer has a thickness between 100 μm and 1500 μm.

Preferably, it has a width of between 100 μm and 1500 μm.

Preferably, the ratio of the width of the spacer to the width of the interconnection space is between 0.1 and 0.5.

The width of the spacer and the width of the interconnection space are measured perpendicular to the facing sides of the adjacent PV cells. The width of the interconnection space is for example between 0.2 and 10 mm.

The spacer may take the form of a strip, in particular of rectangular or square cross section.

The spacer may extend from one end to the other, i.e. the entire length, of the interconnection space between the adjacent photovoltaic cells, said length being measured parallel to the facing lateral sides of said adjacent cells.

The spacer need not be superposed on the region of cell coverage.

Preferably, the spacer is wholly superposed on the interconnection space.

The spacer may be contained between the planes in which the opposite sides of the photovoltaic cells lie.

Preferably, the spacer is entirely incorporated into the bulk of the encapsulation structure. In particular, the or all the outer sides of the spacer make contact with the encapsulation structure.

The distance between the spacer and the interconnector is less than or equal to 1 mm, said distance being measured perpendicular to the median plane in which the PV module extends.

As a variant, at least one part of the spacer may make contact with the interconnector.

The PV module may comprise a plurality of spacers at least partially covering the interconnector in the region of interconnector coverage.

In particular, in the thickness of the PV module, at least two of the spacers are arranged on either side of the interconnector. In other words, at least one of the spacers is arranged between a first side of the PV module and the interconnector and another of the spacers is arranged between the interconnector and a second side of the PV module opposite the first side. This allows the spacers to better accommodate the thermal deformation of the encapsulation structure.

The encapsulation structure is preferably self-supporting. A self-supporting structure is rigid enough not to substantially deform under the effect of its own weight.

The encapsulation structure sandwiches the photovoltaic cells and the interconnector. Preferably, it wholly covers the photovoltaic cells and the interconnector. Preferably, it makes contact over the entire surface area of the photovoltaic cells and over the entire surface area of the interconnector.

The encapsulation material is polymer-based, i.e. more than 70% by weight, preferably more than 80% by weight, preferably more than 90% by weight, preferably more than 95% by weight, and preferably 100% by weight of the encapsulation material is a polymer. The polymer material is suitable for a photovoltaic application, i.e. it has a transmittance such that incident solar radiation is transmitted so as to activate the generation of electricity by the photovoltaic cells.

Preferably, the polymer material is transparent to solar radiation.

The encapsulation material may have a modulus of elasticity between 10 MPa and 10 GPa, at a temperature of −40° C. It may have a Young's modulus between 0.001 GPa and 1 GPa, at a temperature of 20° C.

Preferably, the polymer material is thermoplastic. It may have a glass-transition temperature greater than −150° C.

Preferably, the polymer is selected from ethylene vinyl acetate, ethylene methyl acrylate copolymer, low-density polyethylene terephthalate, nylon 11, polycarbonate, polyethylene terephthalate glycol, polymethyl methacrylate, polypropylene, polypropylene copolymer, polypropylene homopolymer, polytetrafluoroethylene, styrene-acrylonitrile copolymer, thermoplastic polyurethane, acrylonitrile butadiene styrene, polyethylene and blends thereof.

The encapsulation structure may be homogeneous, i.e. consist of the encapsulation material the composition of which is identical everywhere in the encapsulation structure. As will be described below, a homogeneous encapsulation structure may result from thermoforming a bottom layer and a top layer both made of the homogeneous polymer material.

As a variant, the encapsulation structure is multi-layered, at least two layers of the encapsulation structure being made of different encapsulation materials. Preferably, the multi-layered encapsulation structure comprises one or more inner layers that entirely cover and make contact with the photovoltaic cells and the interconnector, and top and bottom layers sandwiching the inner layers, the one or more inner layers and the top and bottom layers being made of different encapsulation materials. The bottom and top layers may be made of the same encapsulation material, and may further comprise reinforcing fibres, glass fibres for example.

Preferably, at a temperature of −40° C., and preferably at a temperature of 20° C., the modulus of elasticity of the encapsulation material from which the one or more inner layers is made is lower than the modulus of elasticity of the encapsulation material from which the bottom layer and/or the top layer is made. The bottom and top layers thus provide the photovoltaic module with flexural rigidity and impact resistance, and the one or more inner layers allow a better distribution of stresses of thermal origin through the photovoltaic module.

Preferably, the thickness of the photovoltaic module stays constant in the region of cell coverage.

Preferably, the thickness of the photovoltaic module stays constant, except in the region of interconnector coverage.

Preferably, the thickness of the photovoltaic module is between 0.75 mm and 10 mm.

The interconnector may be made of a metal selected from copper, silver, tin, lead and alloys thereof.

The interconnector connects two adjacent cells of the photovoltaic unit. Preferably, it is fastened, for example soldered or adhesively bonded with an electrically conductive adhesive, to each of the adjacent cells. Preferably, it is fastened to a bottom side of one of the adjacent photovoltaic cells and to a top side of the other adjacent photovoltaic cell, in order to connect the positive and negative poles of the photovoltaic cells, so as to allow photocurrent to flow.

Preferably, the interconnector lies in the thickness of the photovoltaic module between the adjacent cells that it connects electrically.

The interconnector may have a thickness between 50 μm and 500 μm and/or a width between 200 μm and 2000 μm.

Preferably, the photovoltaic module describes a median surface which may be plane or curved.

The photovoltaic cells preferably likewise describe the median surface.

The photovoltaic unit may comprise more than two photovoltaic cells, and in particular at least three, or even at least five, or indeed at least ten photovoltaic cells.

Within the photovoltaic unit, the photovoltaic cells may be identical. Preferably, they are aligned along an alignment axis on the median surface, the interconnection space between two adjacent photovoltaic cells extending perpendicular to the alignment axis. Their lateral sides may be parallel, and in particular aligned along the alignment axis.

In the variant where the photovoltaic unit comprises more than two photovoltaic cells, the interconnector may electrically connect in series pairwise the adjacent photovoltaic cells. In particular, it may have a portion in contact with one side of a photovoltaic cell, which extends from one edge to another opposite edge of the photovoltaic cell, and which is extended on one side by a portion extending into the interconnection space, which connects the photovoltaic cell to one of the adjacent cells.

The photovoltaic cells may comprise or even consist of silicon. They may be perovskite-on-silicon tandem photovoltaic cells.

Each photovoltaic cell preferably takes the form of a plate, for example a rectangular or square plate. At least one of the photovoltaic cells, and in particular each photovoltaic cell, may have a thickness between 0.05 mm and 0.3 mm.

The photovoltaic module may comprise a plurality of photovoltaic units, which may be arranged with respect to one another so as to tile the median surface, for example along the alignment axis or along two perpendicular axes.

The invention also relates to a process for manufacturing a photovoltaic module according to the invention, the process comprising:

- providing a multilayer stack comprising a photovoltaic unit comprising photovoltaic cells electrically connected in series and spaced apart from one another, the adjacent photovoltaic cells being electrically connected pairwise by an interconnector which extends at least in part into an interconnection space separating said adjacent photovoltaic cells, a spacer which is at least partially superposed on the interconnector in the interconnection region, and at least two encapsulation layers sandwiching the photovoltaic unit and
- thermoforming the multilayer stack until the photovoltaic module is obtained.

The thermoforming may be achieved via thermocompression or lamination.

Preferably, the thermoforming is achieved via lamination of the multilayer stack between a heated bottom lamination plate and a membrane to which a fluid pressure is applied.

The method may comprise a prior step of forming the multilayer stack, said step comprising placing a spacer between the interconnector and at least one encapsulation layer made of the encapsulation material. Moreover, the invention also relates to a device selected from a building, a motor vehicle, a train, an aeroplane and a building, the device incorporating the photovoltaic module according to the invention on an outer surface. The outer surface may be curved. The outer surface of the device is for example a bonnet or roof of a car, or a wall or roof of a building.

According to another embodiment, the spacer may make direct contact with the interconnector over at least part of the interconnection space, and better still over the whole of the interconnection space. The spacer may protrude from the interconnection space. The protrusion of the spacer from the interconnection space may be millimetric in size.

As a variant, the spacer extends at least partially to either side of the interconnector. Preferably, the spacer may coat the interconnector. In this variant, the spacers may be formed from silicone gels or from non-aqueous liquids with a high viscosity, silicone oils for example.

BRIEF DESCRIPTION OF THE DRAWINGS

FIG. 1 and FIG. 2 are photographs of prior-art photovoltaic modules,

FIG. 3 is an optical micrograph of a broken interconnector of a prior-art photovoltaic module, FIG. 4 are electroluminescence images of prior-art photovoltaic modules acquired, from left to right, after lamination, after 30 thermal cycles, and after 60 thermal cycles, FIG. 5 schematically shows a top, front and side view of one example of a photovoltaic module according to the invention, FIG. 6 is a schematic view of the photovoltaic module in cross section through a region of interconnector coverage, FIG. 7 schematically illustrates one example of a process for manufacturing by lamination the photovoltaic module according to the invention, FIG. 8 is a view of a finite-element mesh of part of a module according to the invention such as illustrated in FIG. 6, in the region of interconnector coverage, FIG. 9 are images of the von Mises stress distribution in a reference mesh and in the mesh of FIG. 6 after a numerical thermomechanical simulation of a thermal cycle, FIG. 10 is a graph illustrating the variation in the von Mises stress along the path illustrated in FIG. 6, FIG. 11 is a graph illustrating, for various meshes, the variation in the maximum stress in the interconnector as a function of the modulus of elasticity of the material of the spacer and the decrease, expressed in percent, of said stress with respect to the reference mesh without spacer, FIG. 12 is a graph illustrating, for various meshes, the variation in the maximum stress in the interconnector as a function of the width of the spacer and the decrease, expressed in percent, of said stress with respect to the reference mesh without spacer, and FIG. 13 is a graph illustrating, for various meshes, the variation in the maximum stress in the interconnector as a function of the thickness of the spacer and the decrease, expressed in percent, of said stress with respect to the reference mesh without spacer.

DETAILED DESCRIPTION

FIGS. 1 to 4 were described above.

FIG. 5 illustrates one example of a photovoltaic module 1 according to the invention. The photovoltaic module comprises two photovoltaic units 6, which each comprise spaced apart from one another four photovoltaic cells 3 in wafer form.

Each photovoltaic cell is separated from the photovoltaic cell which is adjacent to it by an interconnection space 2.

This number of photovoltaic units 6 and of photovoltaic cells 3 is non-limiting and other arrangements may be envisaged.

The photovoltaic module further comprises connection terminals 7 taking the form of metal bands, between which the photovoltaic units are arranged in parallel and are electrically connected, in order to collect the generated current.

Within each photovoltaic unit 6, the adjacent photovoltaic cells 3 are connected pairwise in series by metal, copper for example, interconnectors 4 which extend, in the Y direction, from one end to the other between the electrical terminals 7.

Each metal interconnector 4 comprises portions 4*a* making contact with one side of a photovoltaic cell, which portions are connected together by portions 4*b* which each extend into the interconnection space provided between the photovoltaic cells 3. The metal interconnector 4 consecutively makes contact with one side of one photovoltaic cell and then with an opposite side of the adjacent photovoltaic cell. Thus, when observed in the cross-sectional plane (x,z) illustrated in FIG. 6, the interconnector winds from one connection terminal to the other, between the photovoltaic cells 3.

The photovoltaic module further comprises an encapsulation structure 8 based on at least one polymer material, within which encapsulation structure the photovoltaic units 6 are completely immersed.

The encapsulation structure 8 wholly covers the opposite sides 9*a*, 9*b* of the photovoltaic cells 3, thus defining, with each photovoltaic cell 3, a region of cell coverage 10.

Moreover, the encapsulation structure 8 covers the interconnectors in the various interconnection spaces 2 between the adjacent photovoltaic cells, thus defining, with the interconnector 4, a region of interconnector coverage 11. In the example illustrated in FIG. 6, spacers 12 have been incorporated into the bulk of the encapsulation structure 8. They are arranged on either side of the interconnector in each interconnection space 2 between the bottom side 13*i* and the top side 13*s* of said incorporation structure 8 and the interconnector 4.

Within each interconnection space 2, the spacers 12 may extend from one end to the other, i.e. the entire length, of the facing sides of the adjacent photovoltaic cells, and parallel to said sides. They may further be superposed on each other or offset with respect to each other along the y-axis, as illustrated in FIG. 6.

The spacers are moreover superposed on the interconnector 4 in each interconnection space 2, in the region of interconnector coverage, as may be seen in the cross section in a (y,z) plane in FIG. 6.

The spacers are for example an elastomeric strip the modulus of elasticity of which is between 0.1 MPa and 300 MPa.

In order to manufacture the photovoltaic module illustrated in FIG. 5, a multilayer stack 20 may be prepared in the following manner. The photovoltaic units 6, the connection bands 7 and the spacers 12 are arranged between bottom and top sheets 21*i*, 21*s* made of a soft polymer material, of a low modulus of elasticity, between 10 MPa and 10 GPa at −40° C. for example. The sheets 21*i,s* thus entirely cover the photovoltaic units 6, the connection bands 7 and the spacers 12. The assembly thus formed may optionally be arranged between bottom and top external sheets 22*i*, 22*s* made of another rigid other polymer material, of a high modulus of elasticity, between 1 GPa and 100 GPa at −40° C. for example, in order to form the multilayer stack 20. After lamination between a bottom lamination plate 24*i* and a membrane 25, a photovoltaic module 1 is thus obtained, the photovoltaic module having a multilayer encapsulation structure comprising a flexible internal encapsulation layer in which the photovoltaic units are immersed, the flexible internal encapsulation layer optionally being sandwiched between top and bottom rigid external encapsulation layers.

The lamination of the multilayer stack 20 is conventionally carried out by heating the multilayer stack to a temperature suitable for making the polymer materials flow and with a pressure applied to the membrane 25 in order to heat seal the various sheets 21*i,s* and optionally 22*i,s* and the photovoltaic units 6 together, then by cooling until the photovoltaic module is obtained.

The effect of the spacer in the interconnection space is illustrated below.

A 2D finite-element mesh 30 of a portion of the photovoltaic module including the interconnection space 2 was generated, as illustrated in FIG. 8. Quadrangular finite elements were chosen such that the thickness $e_i$ of the interconnector was discretised with at least 4 finite elements.

The encapsulation structure 8 modelled thus comprises bottom and top polyamide layers 11, the modulus of elasticity of which at −40° C. is equal to 1620 MPa and the CTE of which is equal to $10^{-4}$ $K^{-1}$. The thickness of each of the bottom and top layers is 400 μm.

The internal layer 15, of 1200 μm thickness, is made of thermoplastic polyolefin, the modulus of elasticity of which at −40° C. is 590 MPa and the CTE of which is equal to $5\times10^{-4}$ $K^{-1}$.

The photovoltaic cell 3, of thickness equal to 150 μm, is made of silicon, the modulus of elasticity of which is equal to 166 GPa and the CTE of which is equal to $2.6\times10^{-6}$ $K^{-1}$.

The interconnector 4, of thickness equal to 200 μm, is made of copper and has a modulus of elasticity equal to 130 GPa and a CTE equal to $1.4\times10^{-5}$ $K^{-1}$.

The thickness $e_{spacer}$ and width $l_{spacer}$ of the spacers 12 and the modulus of elasticity of the material from which they are made are parameters that were modified during simulation.

The simulations were carried out assuming a plane deformation state, with models of thermoelastic material behaviour, and using the ABAQUS simulation tool. Each finite element was considered to be in a stress-free state at 25° C., then cooling of the photovoltaic module to a temperature of −40° C. was simulated, this temperature being that of the thermal cycling specified in standard IEC6215.

A reference mesh, such as that illustrated in FIG. 8, was generated without any spacer present.

A comparative mesh was also generated, in which the modulus of elasticity of the material of the spacer was 100 GPa, i.e. more than 160 times greater than that of the encapsulation material of the layer 15 and of the encapsulation material of the layers 14*i* and 14*s*. The width $l_{spacer}$ was 1 mm and the thickness $e_{spacer}$ was equal to 200 μm.

A mesh of a PV module according to the invention was generated, the latter being identical to the comparative mesh except that the modulus of elasticity at −40° C. of the material of the spacer was 1 MPa.

FIG. 9 illustrates the effect of thermal expansion between 20° C. and −40° C., which induces von Mises stresses that are higher in the interconnector in the absence of a spacer (mesh 35). The spacer, which is less rigid than the encapsulation material, increases the flexibility of the region of interconnector coverage, the von Mises stresses being lower locally in the interconnector (mesh 36).

This observation is confirmed by FIG. 10, which shows the variation in the von Mises stresses σ, expressed in MPa, as a function of the y-coordinate S (in mm) along the path 37 illustrated in FIG. 8 for the reference mesh 35 (without spacer) (curve 40), for the comparative mesh (curve 41) and for the mesh according to the invention (curve 42). The presence of a spacer having too high a rigidity, greater than the rigidity of the encapsulation materials, increases the concentration of stresses in the central part of the interconnector. The maximum von Mises stress is 39% higher than in the reference mesh without spacer. In contrast, a spacer softer than the encapsulation materials makes it possible to limit this stress concentration, the maximum value of the von Mises stress in the interconnector being decreased by 52%.

FIG. 11 is a graph showing the maximum value of the von Mises stress along the path 37 for meshes in which the spacers all have a square cross section (same width $l_{spacer}$ of 200 μm and same thickness $e_{spacer}$ of 200 μm), the modulus of elasticity varying from 0.1 MPa to 330 MPa. A general increase in von Mises stress is observed with increasing modulus of elasticity.

FIG. 12 illustrates the variation in the maximum value of the von Mises stress in the interconnector, for meshes in which the modulus of elasticity at −40° C. of the material of the spacer is 1 MPa, the thickness $e_{spacer}$ is 200 μm and the width $l_{spacer}$ varies from 200 μm to 1000 μm (the case $l_{spacer}$=0 (corresponds to the reference case without spacer). It may be seen that an increase in the width of the spacer induces a decrease of up to more than 50% in the maximum value of the von Mises stress in the interconnector, compared with the reference case.

FIG. 13 illustrates the variation in the maximum value of the von Mises stress in the interconnector, for meshes in which the modulus of elasticity at −40° C. of the material of the spacer is 1 MPa, the width $l_{spacer}$ is 1000 μm and the thickness $e_{spacer}$ varies from 100 μm to 400 μm (the case $e_{spacer}$=0 corresponds to the reference case without spacer). It may be seen that an increase in the thickness of the spacer induces a decrease of up to more than 80% in the maximum value of the von Mises stress in the interconnector, compared with the reference case.

As should be clear on having read the present description, the invention therefore decreases the risk of rupture of the interconnector during thermal cycling.

The expression "between A and B" is understood to be strictly equivalent to the expression "greater than or equal to A and less than or equal to B".

The invention claimed is:

1. A photovoltaic module comprising:

a photovoltaic unit comprising a plurality of photovoltaic cells electrically connected in series and spaced apart from one another, adjacent photovoltaic cells being electrically connected pairwise by a metal interconnector which extends at least in part into an interconnection space separating said adjacent photovoltaic cells, an encapsulation structure based on at least one polymer encapsulation material, which sandwiches opposite sides of the plurality of photovoltaic cells, defining a region of cell coverage, and sandwiches the interconnector in the interconnection space, defining a region of interconnector coverage, wherein the polymer encapsulation material makes contact over a surface area of the plurality of photovoltaic cells and over a surface area of the interconnector, and a spacer incorporated into the encapsulation structure and partially superposed on the interconnector in the region of interconnector coverage, the spacer being made of a material having at least, at a temperature of −40° C., a modulus of elasticity lower than a modulus of elasticity of the polymer encapsulation material.

2. The photovoltaic module according to claim 1, wherein the material of the spacer has a modulus of elasticity more than 2 times, lower than the modulus of elasticity of the polymer encapsulation material at a temperature of −40° C.

3. The photovoltaic module according to claim 1, wherein the material of the spacer has a modulus of elasticity lower than the modulus of elasticity of the polymer encapsulation material at a temperature of 20° C.

4. The photovoltaic module according to claim 1, wherein the material of the spacer has a modulus of elasticity, measured at −40° C., between 0.1 MPa and 300 MPa.

5. The photovoltaic module according to claim 1, wherein the material of the spacer is an elastomer.

6. The photovoltaic module according to claim 1, wherein the spacer has a thickness between 100 μm and 1500 μm and/or a width between 100 μm and 1500 μm.

7. The photovoltaic module according to claim 1, wherein the spacer takes the form of a strip.

8. The photovoltaic module according to claim 1, wherein the spacer extends from one end to the other along the entire length, of the interconnection space between the adjacent photovoltaic cells, said length being measured parallel to a facing lateral sides of said adjacent cells.

9. The photovoltaic module according to claim 1, wherein the photovoltaic module comprises a plurality of spacers at least partially covering the interconnector in the region of interconnector coverage.

10. The photovoltaic module according to claim 9, wherein, in a thickness of the PV module, at least two spacers are arranged on either side of the interconnector.

11. The photovoltaic module according to claim 1, wherein more than 70% by weight of the polymer encapsulation material is a polymer.

12. The photovoltaic module according to claim 11, wherein the polymer is selected from ethylene vinyl acetate, ethylene methyl acrylate copolymer, low-density polyethylene terephthalate, nylon 11, polycarbonate, polyethylene terephthalate glycol, polymethyl methacrylate, polypropylene, polypropylene copolymer, polypropylene homopolymer, polytetrafluoroethylene, styrene-acrylonitrile copolymer, thermoplastic polyurethane, acrylonitrile butadiene styrene, polyethylene and blends thereof.

13. The photovoltaic module according to claim 1, wherein the polymer encapsulation material is able to have a modulus of elasticity between 10 MPa and 10 GPa, at a temperature of −40° C.

14. A process for manufacturing a photovoltaic module according to claim 1, the process comprising:

providing a multilayer stack comprising a photovoltaic unit comprising photovoltaic cells electrically connected in series and spaced apart from one another, adjacent photovoltaic cells being electrically connected pairwise by an interconnector which extends at least in part into an interconnection space separating said adjacent photovoltaic cells, a spacer which is at least partially superposed on the interconnector in the interconnection space, and at least two encapsulation layers sandwiching the photovoltaic unit and thermoforming the multilayer stack until the photovoltaic module is obtained.

15. The process according to claim 14, wherein the thermoforming is achieved via lamination of the multilayer stack between a heated bottom lamination plate and a membrane to which a fluid pressure is applied.

16. The photovoltaic module according to claim 1, wherein the polymer encapsulation material makes contact over an entire surface area of the plurality of photovoltaic cells and over an entire surface area of the interconnector.

* * * * *